(12) United States Patent
Ning et al.

(10) Patent No.: US 10,164,644 B2
(45) Date of Patent: Dec. 25, 2018

(54) CLOCK SYNCHRONIZATION BETWEEN TIME CALIBRATION BOARDS

(71) Applicant: Shenyang Neusoft Medical Systems Co., Ltd., Shenyang (CN)

(72) Inventors: Peng Ning, Shenyang (CN); Long Yang, Shenyang (CN); Guodong Liang, Shenyang (CN); Peng Gao, Shenyang (CN); Liang He, Shenyang (CN)

(73) Assignee: Shenyang Neusoft Medical Systems Co., Ltd., Shenyang (CN)

( * ) Notice: Subject to any disclaimer, the term of this patent is extended or adjusted under 35 U.S.C. 154(b) by 0 days.

(21) Appl. No.: 15/487,523

(22) Filed: Apr. 14, 2017

(65) Prior Publication Data

US 2017/0302281 A1 Oct. 19, 2017

(30) Foreign Application Priority Data

Apr. 15, 2016 (CN) .......................... 2016 1 0235943

(51) Int. Cl.
*G01T 1/29* (2006.01)
*H03L 7/00* (2006.01)
*G01T 7/00* (2006.01)

(52) U.S. Cl.
CPC .............. *H03L 7/00* (2013.01); *G01T 1/2985* (2013.01); *G01T 7/005* (2013.01)

(58) Field of Classification Search
CPC .......... H03L 7/00; G01T 1/2985; G01T 7/005
See application file for complete search history.

(56) References Cited

U.S. PATENT DOCUMENTS 7,839,221 B2 * 11/2010 Kossel .................... H03L 7/089
327/156
2003/0107417 A1 6/2003 Roberts

FOREIGN PATENT DOCUMENTS

| CN | 103383539 A | | 11/2013 | |
|----|-------------|---|---------|------------|
| CN | 105262463 A | | 1/2016 | |
| CN | 105262463 A | * | 1/2016 | H03K 5/135 |

OTHER PUBLICATIONS

State Intellectual Property Office of the People's Republic of China, Office Action and Search Report Issued in Chinese Application No. 201610235943.1 dated Oct. 20, 2017, 6 pages (with English-language translation thereof, 7 pages).

* cited by examiner

*Primary Examiner* — Jung Kim
(74) *Attorney, Agent, or Firm* — Fish & Richardson P.C.

(57) ABSTRACT

Methods, devices and computer-readable mediums for clock synchronization are provided. The methods include receiving a synchronizing clock in a unit clock cycle of a measuring clock, calibrating position information of a rising edge of the synchronizing clock in the unit clock cycle, determining a phase difference between the measuring clock and the synchronizing clock in the unit clock cycle based on the calibrated position information, and compensating a photon time in the unit clock cycle with the determined phase difference as a time compensation value.

17 Claims, 6 Drawing Sheets

CLOCK SYNCHRONIZATION BETWEEN TIME CALIBRATION BOARDS

CROSS REFERENCE TO RELATED APPLICATIONS

This application claims priority under 35 U.S.C. § 119 to Chinese Patent Application No. 201610235943.1 filed on Apr. 15, 2016, the entire content of which is incorporated herein by reference.

TECHNICAL FIELD

The present disclosure relates to medical imaging diagnostics, particularly for clock synchronization between time calibration boards.

BACKGROUND

In the imaging diagnostic techniques of the medical field, a particular material is typically enabled to pass through a scanned object, and is received by a detection device after passing through the scanned object. A tissue image of the scanned object may be reconstructed according to the received information of the particular material, thus allowing diagnosis of focuses of the scanned object according to the image. A processing procedure of image reconstruction according to the material information after the material information is received may influence the efficiency of the image reconstruction.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices, and computer-readable mediums for clock synchronization between time calibration boards, for example, in molecular imaging diagnosis apparatus, which can improve the accuracy of clock synchronization between the time calibration boards, thus improving the accuracy of subsequent compliance determination.

One aspect of the present disclosure features a method of clock synchronization. The method includes receiving a synchronizing clock in a unit clock cycle of a measuring clock, calibrating position information of a rising edge of the synchronizing clock in the unit clock cycle, determining a phase difference between the measuring clock and the synchronizing clock in the unit clock cycle based on the calibrated position information, and compensating a photon time in the unit clock cycle with the determined phase difference as a time compensation value.

In some implementations, calibrating the position information of the rising edge of the synchronizing clock in the unit clock cycle includes statistically averaging position information of the rising edge of the synchronizing clock obtained before the calibrating in a current unit clock cycle and position information of rising edges calibrated in predetermined times of unit clock cycles prior to the current unit clock cycle, and determining a result of the statistically averaging to be the position information of the rising edge in the current unit clock cycle.

In some implementations, calibrating the position information of the rising edge of the synchronizing clock in the unit clock cycle includes generating a calibration clock having a clock cycle shorter than a clock cycle of the synchronizing clock, the clock cycle of the calibrating clock including a plurality of carry chains, and determining, by the calibration clock, the position information of the rising edge of the synchronizing clock using the carry chains and the clock cycle of the calibrating clock.

In some examples, a clock cycle of the measuring clock is shorter than a clock cycle of the synchronizing clock, and the clock cycle of the measuring clock is timed by a plurality of carry chains, and calibrating the position information of the rising edge of the synchronizing clock in the unit clock cycle can include determining the position information of the rising edge of the synchronizing clock in the unit clock cycle by using the carry chains and the clock cycle of the measuring clock.

The method can further include generating the measuring clock configured to calibrate the photon time, a length of a clock cycle of the measuring clock being determined based on a length of a time slice during which at most one photon time is detected.

The unit clock cycle can be based on a clock cycle of the synchronizing clock and a clock cycle of the measuring clock. In some cases, the unit clock cycle includes one clock cycle of the measuring clock when the clock cycle of the synchronizing clock is same as the clock cycle of the measuring clock. In some other cases, the unit clock cycle includes two or more clock cycles of the measuring clock when the clock cycle of the synchronizing clock is longer than the clock cycle of the measuring clock.

Receiving the synchronizing clock can include receiving the synchronizing clock from a compliance processing board, and the compliance processing board can be configured to transmit the synchronizing clock to a plurality of time calibration boards for clock synchronization between the plurality of time calibration boards.

The method can further include transmitting the compensated photon time to the compliance processing board, and the compliance processing board can be configured to receive photon times from the plurality of time calibration boards and carry out compliance determination among the received photon times.

The method can further include: after receiving the synchronizing clock from the compliance processing board for a predetermined period of time and before calibrating the position information of the rising edge of the synchronizing clock in the unit clock cycle, receiving a reset signal from the compliance processing board for transmitting the reset signal to the plurality of time calibration boards for simultaneously resetting the plurality of time calibration boards, and the predetermined period of time is configured to ensure that the plurality of time calibration boards to be synchronized have started to operate in the predetermined period of time.

Receiving the synchronizing clock can include receiving the synchronizing clock via a shielded wire.

Another aspect of the present disclosure features a device for clock synchronization. The device includes a clock generating module configured to locally generate a measuring clock for calibrating a photon time, a position calibrating module configured to receive a synchronizing clock in a unit clock cycle of the measuring clock and calibrate a position information of a rising edge of the synchronizing clock in the unit clock cycle, a compensation determining module configured to determine a phase difference between the measuring clock and the synchronizing clock in the unit clock cycle based on the calibrated position information, and a time compensating module configured to compensate the photon time with the determined phase difference as a time compensation value after the photon time is calibrated in the unit clock cycle of the measuring clock.

In some implementations, the position calibrating module is configured to calibrate the position information of the rising edge of the synchronizing clock in the unit clock cycle by statistically averaging position information of the rising edge of the synchronizing clock obtained before the calibrating in a current unit clock cycle and position information of rising edges calibrated in predetermined times of unit clock cycles prior to the current unit clock cycle, and determining a result of the statistically averaging to be the position information of the rising edge in the current unit clock cycle.

In some implementations, the position calibrating module is configured to calibrate the position information of the rising edge of the synchronizing clock in the unit clock cycle by generating a calibration clock having a clock cycle shorter than a clock cycle of the synchronizing clock, the clock cycle of the calibrating clock including a plurality of carry chains, and determining, by the calibration clock, the position information of the rising edge of the synchronizing clock using the carry chains and the clock cycle of the calibrating clock.

In some examples, a clock cycle of the measuring clock is shorter than a clock cycle of the synchronizing clock, and the clock cycle of the measuring clock is timed by a plurality of carry chains, and the position calibrating module can be configured to calibrate the position information of the rising edge of the synchronizing clock in the unit clock cycle by determining the position information of the rising edge of the synchronizing clock in the unit clock cycle by using the carry chains and the clock cycle of the measuring clock.

A length of a clock cycle of the measuring clock can be determined based on a length of a time slice during which at most one photon time is detected, and the unit clock cycle can be based on the clock cycle of the measuring clock and a clock cycle of the synchronizing clock. In some cases, the unit clock cycle includes one clock cycle of the measuring clock when the clock cycle of the synchronizing clock has the same length the clock cycle of the measuring clock. In some other cases, the unit clock cycle includes two or more clock cycles of the measuring clock when the clock cycle of the synchronizing clock is longer than the clock cycle of the measuring clock.

The position calibrating module can be configured to receive the synchronizing clock from a compliance processing board that is configured to transmit the synchronizing clock to a plurality of time calibration boards for clock synchronization between the plurality of time calibration boards.

The device can further include a transmitting module configured to transmit the compensated photon time to the compliance processing board, and the compliance processing board is configured to receive photon times from the plurality of time calibration boards and carry out compliance determination among the received photon times.

The device can further include a reset notifying module configured to, after receiving the synchronizing clock from the compliance processing board for a predetermined period of time and before calibrating the position information of the rising edge of the synchronizing clock in the unit clock cycle, receive a reset signal from the compliance processing board for transmitting the reset signal to the plurality of time calibration boards for simultaneously resetting the plurality of time calibration boards, and the predetermined period of time is to ensure that the plurality of time calibration boards to be synchronized have started to operate in the predetermined period of time.

The synchronizing clock can be transmitted from the compliance processing board to the plurality of time calibration boards via shielded wires.

A further aspect of the present disclosure features a non-transitory computer-readable storage medium having instructions stored thereon which, when executed by one or more processors, cause the one or more processors to perform a method of clock synchronization, for example, as described above. The method includes receiving a synchronizing clock in a unit clock cycle of a measuring clock, calibrating position information of a rising edge of the synchronizing clock in the unit clock cycle, determining a phase difference between the measuring clock and the synchronizing clock in the unit clock cycle based on the calibrated position information, and compensating a photon time in the unit clock cycle with the determined phase difference as a time compensation value.

The details of one or more embodiments of the subject matter described in the present disclosure are set forth in the accompanying drawings and description below. Other features, aspects, and advantages of the subject matter will become apparent from the description, the drawings, and the claims.

DETAILED DESCRIPTION

Figure 1:
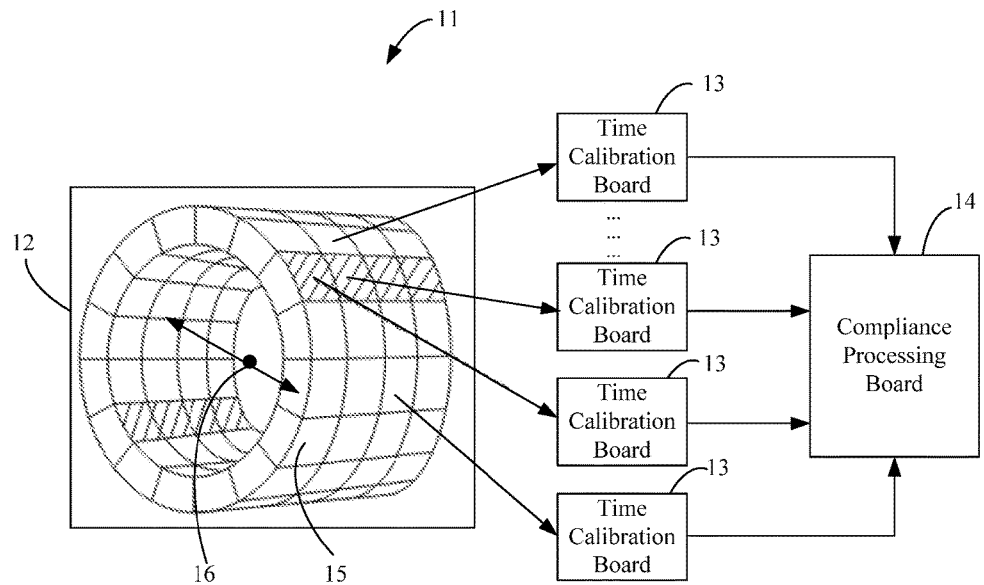
FIG. 1 is a system structural schematic diagram of a Positron Emission Tomograph (PET) system in accordance with one or more examples of the present disclosure.

A Positron Emission Tomograph (abbreviated as PET) system is an advanced molecular imaging diagnosis apparatus in the medical field. When the PET is used for diagnosis, a deoxyglucose marker containing positron-emitting nuclides can be selected as a tracer and injected into the body of an object. After the tracer enters into the body, the positron-emitting nuclides therein may release positrons e+. A positron e+, after moving in the body for a certain distance, may annihilate a negatron e− in its surroundings to produce a pair of γ-photons that are equal in energy and opposite in direction of propagation. This process is known as a positron annihilation event. A detection device using the PET system is capable of detecting the γ-photon pairs, thus, the presence of the positrons e+ may be analyzed, and a concentration distribution of the tracer in the body of the object may be obtained, whereby focuses of diseases may be determined.

If a γ-photon pair from the same positron annihilation event is detected, it is known as that a compliance event is detected. A method of detecting a compliance event includes time compliance determination. For example, a detection device of the PET system includes a plurality of BLOCK modules for receiving γ-photons. In a time period of a time slice, each BLOCK module may capture one γ-photon at most. The time period of the time slice can be shorter than a dead time of detecting the γ-photon by the PET. The time when the γ-photon is detected by the BLOCK module may be determined by a time calibration board connected to the BLOCK module. Assuming that each of two BLOCK modules detects one γ-photon and the time calibration boards connected to the two BLOCK modules are different, a determination on the time compliance will then be made according to γ-photon receiving times determined by respective corresponding time calibration boards. If a time difference between two receiving times is within a compliance time window, it indicates that the two γ-photons are from the same annihilation event, and a compliance event is thus determined.

It thus can be seen that clock synchronization between different time calibration boards is very important. The receiving times of photons can be accurately measured when clock synchronization is achieved between the time calibration boards so that time compliance determination is made more accurately; otherwise, in case of clock asynchronization between the boards, a wrong time compliance determination result may be produced. For example, a non-compliance event may be determined as the compliance event. An error in the compliance determination may influence the quality of subsequent image reconstruction.

Implementations of the present disclosure provide a method of performing clock synchronization on time calibration boards connected to BLOCK modules of a detection device in an imaging system. The method, for example, may be applied to a PET system, such that the calibration on photon time by the time calibration boards in the PET system is more accurate, thus allowing improvement of the accuracy of compliance event determination.

FIG. 1 illustrates a structure of an example PET system. The PET system 11 may include a detection device 12, a plurality of time calibration boards 13, and a compliance processing board 14. The detection device 12 may include a plurality of BLOCK modules 15 each including a plurality of crystals. A positron annihilation event 16 occurring in a scanned object located in an internal space of the detection device 12 produces two γ-photons that may be received by the crystals in the BLOCK modules 15.

As shown in FIG. 1, the detection device 12 of the PET system 11 includes a plurality of BLOCK modules 15. During a time slice, each of these BLOCK modules may capture one γ-photon at most. The time of receiving the γ-photon by a crystal is referred to be a photon time. After a BLOCK module receives a γ-photon, the photon time of the γ-photon can be calibrated by the time calibration board 13 connected to the BLOCK module 15. For example, assuming that a particular crystal in a particular BLOCK module 15 detects a γ-photon produced in an annihilation event, the BLOCK module 15 can generate an electric trigger signal that can be transmitted to the time calibration board 13. The time calibration board 13 may include a hardware circuit having a structure, e.g., a Field-Programmable Gate Array (FPGA) or the like. By using the time calibration board 13 to process the electric trigger signal, the photon time when the γ-photon is detected may be determined.

As shown in FIG. 1, each BLOCK module 15 may be correspondingly connected to a time calibration board 13, whereas a time calibration board 13 may be connected to a plurality of BLOCK modules 15. Assuming that a number of the time calibration boards 13 in total of the PET system 11 is m that is a natural number greater than 1, and a number of the BLOCK modules 15 connected to each time calibration board 13 is n that is a natural number greater than 1, thus a number of the total BLOCK modules 15 in the PET system 11 is m*n. If each of the BLOCK modules 15 detects one γ-photon at most during a time slice, there can be m*n photon times at most determined or obtained during the time slice.

The photon times obtained through calibration by respective time calibration boards 13 can be transmitted to the compliance processing board 14. According to these photon times, the compliance processing board 14 can carry out a compliance determination, including determination of time compliance. For example, the compliance processing board 14 may determine whether a time interval of two photon times among these photon times within one time slice is within a compliance time window. If the time interval is within the compliance time window, two γ-photons corresponding to the two photon times may be produced by the same annihilation event. Subsequently, spatial compliance determination can be carried out on the two γ-photons to finally determine the compliance event, e.g., to determine a response line corresponding to the annihilation event.

As can be seen from the above descriptions, the time calibration boards are very important for accurate calibration of the photon times, and whether a clock used for calibrating the photon times between the different time calibration boards is synchronized has a direct influence on the accuracy of the compliance event determination in the PET system 11. For example, if clocks between the time calibration boards are not synchronized, a wrong time compliance determination may be produced; for example, a non-compliance event may be determined as a compliance event, and an error in the compliance determination can influence the quality of subsequent image reconstruction.

The present disclosure provides a method of clock synchronization between time calibration boards, which enables to improve the accuracy of clock synchronization between the time calibration boards, thus improving the accuracy of subsequent time compliance determination.

FIG. 1 shows example time calibration boards configured to execute a method of clock synchronization between time calibration boards. Each of the time calibration boards may include a hardware circuit such as a Field-Programmable Gate Array (FPGA) so that calibration on photon time may be performed by using the hardware circuit. In operation, the calibration on photon times by the time calibration boards can be achieved by clocks on the time calibration boards. As the clocks on the time calibration boards are used for calibrating photon time, the clocks may be referred to be measuring clocks.

Figure 2:
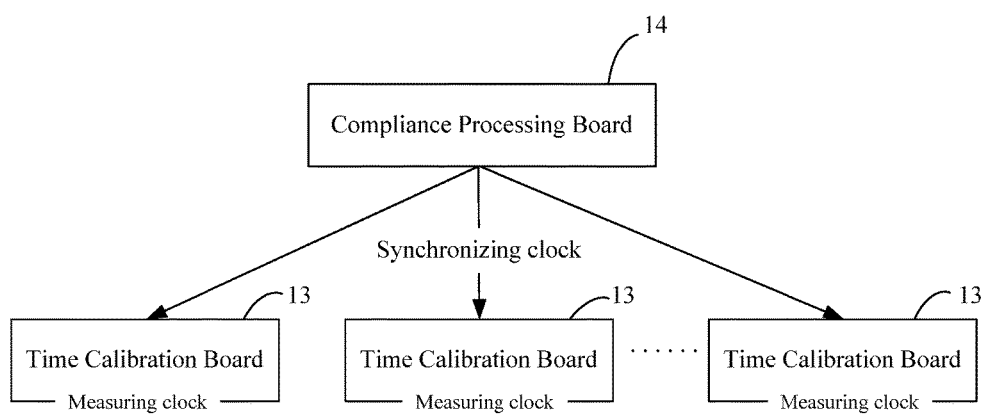
FIG. 2 is a schematic diagram of clock transmission in accordance with one or more examples of the present disclosure.

As illustrated in FIG. 2, the different time calibration boards 13 of the PET system 11 can be independent from one another without a transmission medium therebetween. To achieve clock synchronization between the measuring clocks respectively generated by these time calibration boards, the compliance processing board 14 may transmit a synchronizing clock to each time calibration board 13. The synchronizing clock may serve as a synchronization reference for the measuring clocks on the different time calibration board 13, and synchronization between the different measuring clocks may be realized as long as the different measuring clocks are synchronized with the synchronizing clock, respectively.

In some implementations, the time calibration board 13 is configured to locally generate a measuring clock. The measuring clock can be set to have a frequency of 4 MHz, i.e., having a corresponding clock cycle of 250 ns. The length of the clock cycle can be set according to a time length of a time slice. In some cases, the time length of a time slice is shorter than a dead time of detecting the γ-photon by the crystal in the detection device 12 of the PET system 11. The measuring clock locally generated by the time calibration board 13 can have no signal loss, which can be more accurate than the measuring clock externally transmitted to the time calibration board 13 where signal loss may occur during the external transmission process and lead to an inaccurate clock. Also, the synchronizing clock transmitted by the compliance processing board 14 to the time calibration boards 13 can be transmitted by shielded wires, thereby minimizing the influence on the clock signal transmitted by the shielded wires. In some cases, the synchronizing clock has the same clock cycle as the measuring clock locally generated by the time calibration board 13, e.g., both of the clock cycles can be 250 ns.

Figure 3:
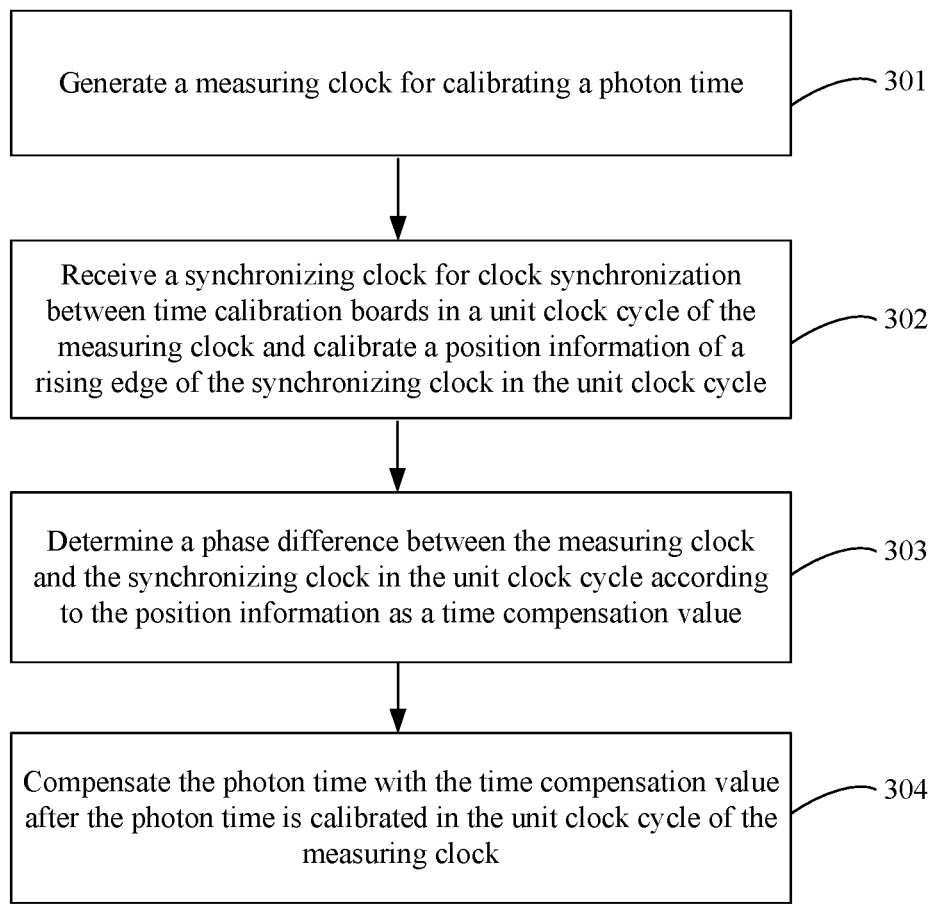
FIG. 3 is a flow diagram of a method of clock synchronization in accordance with one or more examples of the present disclosure.

The time calibration board 13 can start to execute the processing of clock synchronization between the synchronizing clock and the local measuring clock after receiving the synchronizing clock sent from the compliance processing board 14. FIG. 3 shows an example process of a method of clock synchronization.

In step 301, a time calibration board locally generates a measuring clock corresponding to one time slice. The measuring clock is configured to calibrate a photon time. This step can be the same as described above and not described again in detail herein.

In step 302, the time calibration board receives a synchronizing clock within a unit clock cycle of the measuring clock and calibrate a position information of a rising edge of the synchronizing clock in the unit clock cycle.

Figure 4:
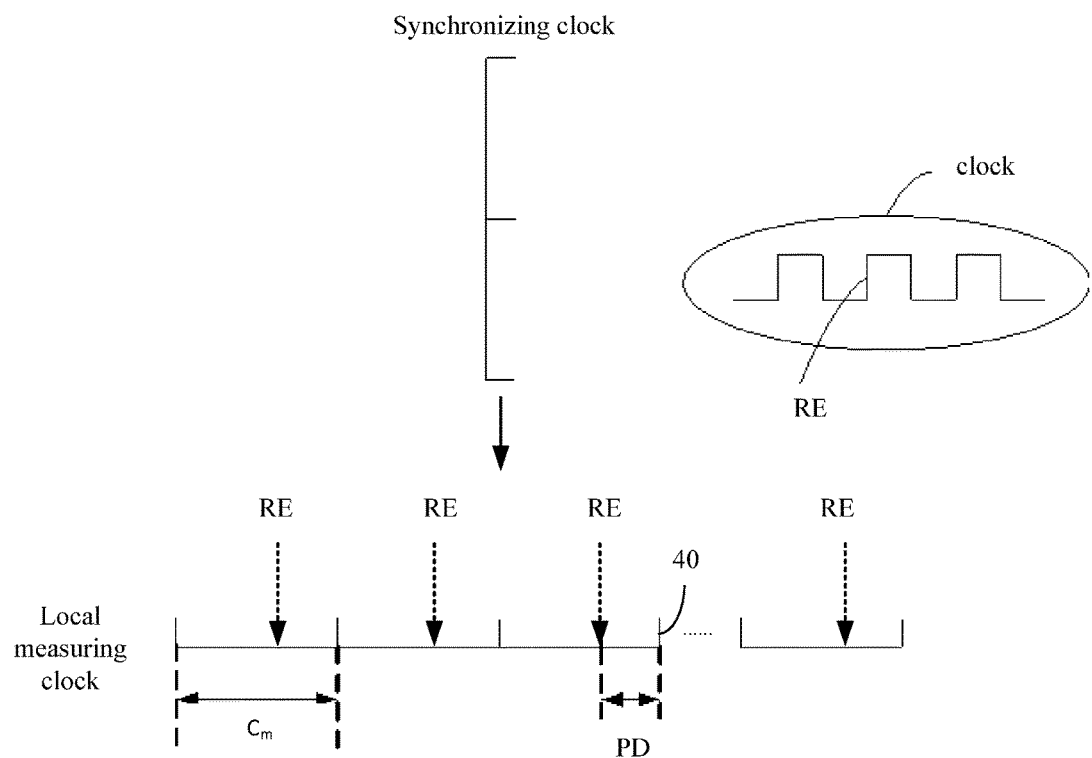
FIG. 4 is a schematic diagram of a clock relation in accordance with one or more examples of the present disclosure.

FIG. 4 shows an example relation between the local measuring clock and the synchronizing clock when a time calibration board is performing the clock synchronization. The local measuring clock can be a clock having a cycle $C_m$ of 250 ns, and the synchronizing clock transmitted by the compliance processing board 14 can be also a clock having a cycle of 250 ns. The compliance processing board 14 can continuously transmit the synchronizing clock to the time calibration board 13 at a frequency of 4 MHz such that the time calibration board 13 can perform synchronization calibration of the local measuring clock thereof according to the synchronizing clock.

For illustration only, the following descriptions are made with an example of the local measuring clock and the synchronizing clock both having the same clock cycle. Alternatively, the local measuring clock may also have a clock cycle different from that of the synchronizing clock. For example, the frequency of the synchronizing clock is 4 MHz, while the frequency of the local measuring clock is 8 MHz. The clock frequency of the local measuring clock may be greater than or equal to the clock frequency of the synchronizing clock; that is, the clock cycle of the local measuring clock may be less than or equal to the clock cycle of the synchronizing clock.

A clock includes rising edges RE and falling edges FE. As shown in FIG. 4, when the synchronizing clock arrives at the time calibration board 13, it may be that a rising edge RE of the synchronizing clock arrives in each clock cycle $C_m$ of the measuring clock. A time difference between the rising edge RE and an end 40 of the clock cycle $C_m$ in which the rising edge RE is present is a phase difference PD between the synchronizing clock and the measuring clock, which indicates asynchronization of the synchronizing clock and the measuring clock. To synchronize the two clocks, the phase difference PD may need to be compensated; namely, if the photon time obtained by the time calibration board 13 using the measuring clock is t1, the above phase difference PD needs to be added to the t1 for compensation. Then, the compensated time, that is, t1+PD, is determined to be the photon time of the photon and then sent to the compliance processing board 14 for performing the time compliance determination.

In some examples, the time calibration board 13 is configured to calibrate, in each clock cycle $C_m$ of the local measuring clock, an arrival position of the rising edge RE of the synchronizing clock in the clock cycle, which may be referred to be position information of the rising edge, and then the phase difference PD in the clock cycle $C_m$ can be determined to be a compensation value based on the position information. Since different time calibration boards 13 may differ in power-on operating time, in some examples, after being transmitted to the time calibration boards 13, the synchronizing clock on the time calibration boards 13 is configured to count for a period of time, and then the compliance processing board 14 sends a reset signal to the time calibration boards 13. The reset signal can be sent after the different time calibration boards 13 has been powered on and operate normally, such that the different time calibration boards 13 can reset simultaneously. That is, the time calibration boards 13 may receive the reset signal for local resetting after a predetermined timing time. The setting of the predetermined timing time ensures that all the time calibration boards 13 to be synchronized have already started operating after the predetermined timing time. Each time calibration board 13 starts to calibrate the position information of the rising edge of the synchronizing clock after receiving the reset signal.

A calibrating clock including carry chains can be generated locally by the time calibration board and configured to calibrate the position information of the rising edge of the synchronizing clock. The clock cycle of the calibrating clock can be less than the clock cycle of the synchronizing clock. For example, a calibrating clock may be a 200 MHz clock with a clock cycle of 5 ns, and a clock cycle of synchronizing clock can correspond to 50 clock cycles of the calibrating clock. The calibrating clock times by a plurality of carry chains, and a length of one carry chain may be 200 ps.

Figure 5:
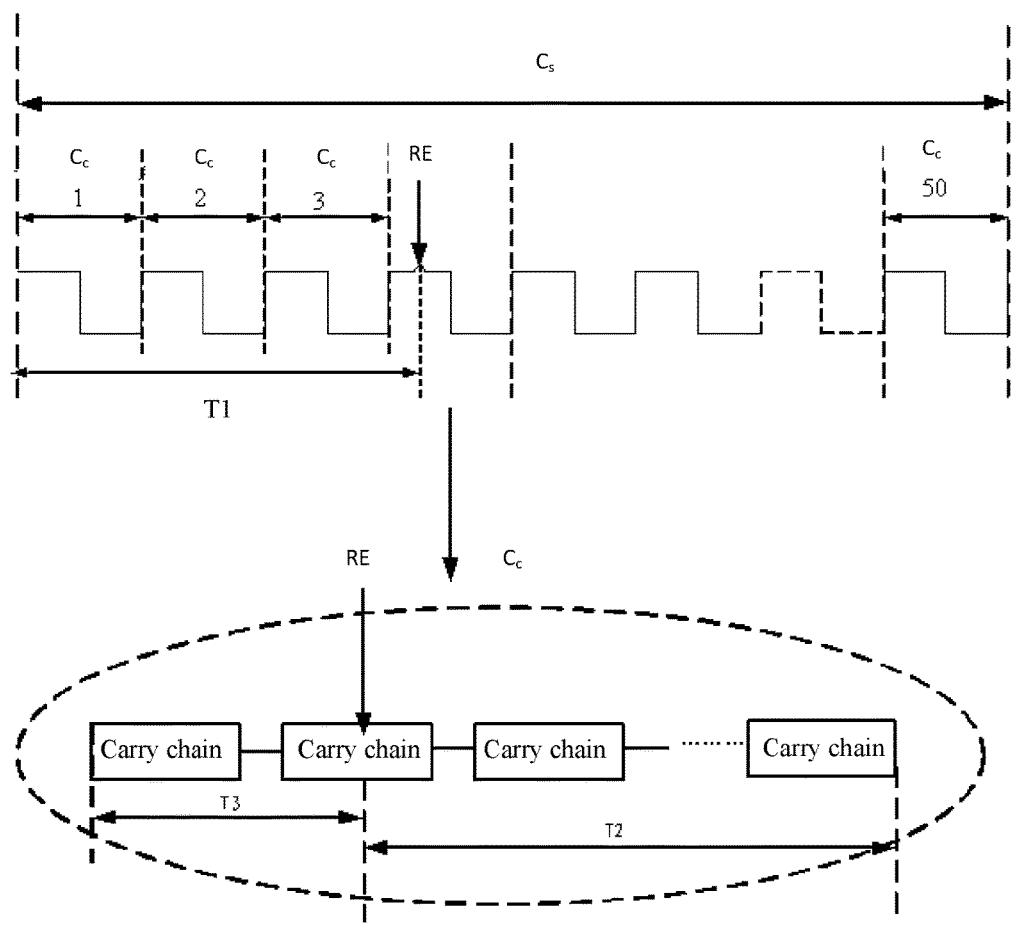
FIG. 5 is a schematic diagram of a clock calibration principle in accordance with one or more examples of the present disclosure.

As illustrated in FIG. 5, one clock cycle $C_s$ of the synchronizing clock may correspond to the 50 clock cycles $C_c$ of the calibrating clock, and the clock cycle $C_c$ of each calibrating clock includes a plurality of carry chains, for example, the length of one carry chain may be 200 ps. Assuming that the rising edge RE of the synchronizing clock is falling in the fourth calibrating clock cycle in FIG. 5, then the time period T1 shown in FIG. 5 is the position of the rising edge RE to be calibrated. The time period T1 is equal to the time length of three calibrating clock cycles $C_c$ plus a part of the fourth calibrating clock cycle $C_c$. This part is timed by the carry chain of the fourth calibrating clock cycle $C_c$ and is equal to the clock cycle $C_c$ of the calibrating clock minus a time period T2 shown in FIG. 5, i.e., equal to a time period T3. The time period T3 plus the time length of the above three calibrating clock cycles $C_c$ is equal to the time period T1. The method of determining the position of the rising edge of the synchronizing clock by combining the calibrating clock with the carry chain may obtain higher accuracy position information of the rising edge of the synchronizing clock. As the time length of each carry chain is 200 ps, the position deviation of the rising edge can be controlled within 200 ps, so that the position information can be obtained with high accuracy.

Referring back to FIG. 3, in step 303, the time calibration board may determine a phase difference between the measuring clock and the synchronizing clock according to the position information of the rising edge and use the phase difference as a time compensation value.

For example, assuming that in a particular clock cycle of the local measuring clock of a time calibration board 13, the position information of the rising edge of the synchronizing clock in the clock cycle, which is determined by both the calibrating clock and the carry chain, is 170.2 ns. The phase difference between the measuring clock and the synchronizing clock can be determined to be: 250 ns−170.2 ns=79.8 ns, where 250 ns is the length of the clock cycle of the local measuring clock. The determined phase difference, i.e., 79.8 ns, can then be utilized as the compensation value for the photon time, that is, the compensation value for the photon time received by the time calibration board 13 in the same clock cycle.

In step 304, the time calibration board compensates the photon time obtained in the unit clock cycle with the compensation value.

For example, assuming that the above clock cycle is Q and the time compensation value determined according to the position information of the synchronizing clock in the clock cycle is 79.8 ns, and if the photon time detected in the clock cycle Q is S, the time compensation value 79.8 ns can be added to the detected photon time S and then sent for compliance processing. Assuming that the rising edge position of the synchronizing clock calibrated by the time calibration board 13 in another clock cycle is not 170.2 ns, the phase difference between the measuring clock and the synchronizing clock may then be re-determined using the same method for the above clock cycle, and the compensation of the photon time in the another clock cycle is carried out according to a re-determined time compensation value. That is to say, for the local measuring clock of the time calibration board, the rising edge position of the synchronizing clock may be calibrated in each clock cycle of the measuring clock, and then the time compensation value corresponding to the clock cycle is determined.

In some cases, the synchronizing clock arrives a first time calibration board B1 and a second time calibration board B2, respectively, and a corresponding rising edge of the synchronizing clock may be in a clock cycle of a particular measuring clock of each of the two time calibration boards B1 and B2. According to the method as described above, if the phase difference between the measuring clock and the synchronizing clock in the time calibration board B1 is 79.8 ns, and the position of the rising edge of the synchronizing clock measured by the time calibration board B2 is 192.6 ns, that is, the phase difference is 250 ns−192.6 ns=57.4 ns, then the time calibration board B1 and the time calibration board B2 can compensate the photon times detected in the corresponding clock cycles with the calculated phase differences as the compensation values, respectively. After compensation, the local measuring clocks on the first and second time calibration boards B1 and B2 are both consistent with the synchronizing clock in terms of phase, and equivalently, both are aligned to a reference clock (e.g., the synchronizing clock); accordingly, time synchronization is also realized between the two time calibration boards B1 and B2.

The different time calibration boards 13 in the PET system 11 can calculate the phase differences and compensate the photon times according to the method described above to ensure clock synchronization between the different time calibration boards 13. When the compensated photon times are sent to the compliance processing board 14 for time compliance determination, a higher accuracy of the determination may be achieved. In addition, in the above example, when the local measuring clock and the synchronizing clock have the same clock frequency, the rising edge of the synchronizing clock may be received in each clock cycle of the local measuring clock; and when the local measuring clock and the synchronizing clock are different in clock frequency, for example, the local measuring clock has a clock frequency of 8 MHz and the synchronizing clock has a clock frequency of 4 MHz, the local measuring clock may receive the rising edge of one synchronizing clock in every two clock cycles. The above unit time (e.g., each clock cycle or every two clock cycles) of receiving the rising edge of the synchronizing clock may be referred to as the unit clock cycle. When the number of the clock cycles included in the unit clock cycle is greater than 1, the position information of the rising edge of the synchronizing clock in the unit clock cycle may be calibrated according to the same method above, whereby the phase compensation value is further calculated.

Additionally, in the above example, the calibrating clock is taken as an instance, and the rising edge position of the synchronizing clock is calibrated by means of the calibrating clock. In other examples, the local measuring clock may also be used to calibrate the rising edge position of the synchronizing clock. If the measuring clock is used for calibration, the clock frequency of the measuring clock may be set to be higher than the clock frequency of the synchronizing clock. For example, assuming that the clock frequency of the synchronizing clock is 4 MHz, then the clock frequency of the measuring clock may be set to be twice of the clock frequency of the synchronizing clock, i.e., 8 MHz. When the measuring clock is used to calibrate the rising edge of the synchronizing clock, a time slice for calibrating the photon time may be identified by a plurality of clock cycles accordingly. If the calibrating clock is used to calibrate the rising edge of the synchronizing clock and the clock cycle of the measuring clock is set to be consistent with the time slice, the subsequent photon time processing may be facilitated. Also, the calibrating clock and the measuring clock may be homologous clocks generated by the same clock but different in frequency; the phases of the two may be aligned, and the time slices can be distinguished accurately.

In another example, theoretically, if the influence of the lines connecting the compliance processing board 14 with the time calibration boards 13 and the influence of phase drift factors of clocks are not considered, for a time calibration board 13, the calibrated position of the rising edge of the synchronizing clock (i.e., the rising edge position) received in each clock cycle of the local measuring clock of the time calibration board 13 should be the same in all the clock cycles. For example, in one clock cycle of the measuring clock, the calibrated rising edge position of the synchronizing clock is 170 ns, and in another clock cycle, the calibrated rising edge position of the synchronizing clock is also 170 ns. According to this theory, the time calibration board 13 does not need to calculate the phase difference and the compensation value for each clock cycle, and may just calculate them once. However, due to practical factors including longer shielded wires between the compliance processing board 14 and the time calibration board 13, influences of temperature and humidity affecting a chip used by the compliance processing board 14 to generate the synchronizing clock, and ease to cause phase drift of the synchronizing clock, when the synchronizing clock arrives the time calibration board 13, rising edge positions of the synchronizing clock in the clock cycles of the measuring clock of the time calibration board 13 may constantly change, which may be referred to as clock jitter.

To smooth the clock jitter problem mentioned above and to eliminate errors caused by the jitter in different clock cycles, the position information of the rising edge can also be determined by statistical averaging. For example, the rising edge positions in the different clock cycles may be statistically accumulated; after N number of the rising edge positions is calculated through continuously statistical accumulation, when the (N+1)th number arrives, the position information thereof is added to previous N number of position information with the first calculated rising edge position being subtracted, such that the accumulated total number is kept to be N without changing; and then statistical averaging is carried out to achieve dynamically de-jittering. Note that N can be an optimum value determined according to actual adjustment results to achieve higher accuracy of compliance determination by using the photon times compensated with the N number of position information of the rising edges.

For example, assuming that N is equal to 4096, the rising edge positions of the synchronizing clock in different clock cycles from the first clock cycle up to the $4095^{th}$ clock cycle of the measuring clock may be determined according to the above method, respectively, whereby the photon times are compensated; when $4096^{th}$ clock cycle arrives, the rising edge position of the synchronizing clock calibrated in the $4096^{th}$ clock cycle and the previous 4095 rising edge positions of the synchronizing clock are accumulated and then averaged. The averaged rising edge position of the synchronizing clock is regarded as the rising edge position information in the $4096^{th}$ clock cycle. Assuming that the $4097^{th}$ clock cycle arrives, the rising edge position calibrated in the $4097^{th}$ clock cycle is accumulated to all the previous rising edge position information with the rising edge position calibrated in the first clock cycle being subtracted, such that the accumulated number of the rising edge positions is kept at 4096, and then averaging is carried out to obtain the rising edge position information of the $4097^{th}$ clock cycle. Alternatively, it may also be the following case: phase compensation is not carried out temporarily from the first clock cycle up to the $4095^{th}$ clock cycle of the measuring clock because the rising edge position of the synchronizing clock is still unstable in this period of time, and keeps waiting until the $4096^{th}$ clock cycle, the statistical averaging is carried out in the subsequent every clock cycle according to the above method.

It still needs to be noted that the time calibration board 13 performs the statistical averaging on the rising edge positions of the synchronizing clock according to the above method so that the compensation phase differences between the different time calibration boards 13 may be stable, thus allowing more accurate effect of clock synchronization between the different time calibration boards 13. For example, assuming that there are two time calibration boards B1 and B2, the phase difference between the synchronizing clock and the local measuring clock of the time calibration board B1 calculated when the rising edge in a certain clock cycle of the synchronizing clock falls on the time calibration board B1, is X1, and the phase difference between the synchronizing clock and the local measuring clock of the time calibration board B2 calculated when the rising edge falls on the time calibration board B2, is X2, then the phase difference between the two time calibration boards B1 and B2 is equal to the difference between X1 and X2. For example, if the above statistical averaging for de-jittering is not carried out, the phase difference between the time calibration boards B1 and B2 in a certain clock cycle may be 80, while the phase difference between the time calibration boards B1 and B2 in another clock cycle may be 120 and the phase difference between the time calibration boards B1 and B2 in further another clock cycle may be 100, etc. in other words, the actually compensated phase differences between the time calibration boards also jitter constantly. After the above statistical averaging processing is carried out, the phase difference between the time calibration boards B1 and B2 may be stabilized at about 100, that is, (80+120+100)/3=100; thus, a better effect of synchronization compensation between the time calibration boards is achieved.

The method of clock synchronization provided by the present example achieves clock synchronization between the different time calibration boards by keeping the measuring clocks of the different time calibration boards to have the same phase with the synchronizing clock. Also, for each time calibration board, a dynamic compensation mode is realized by the method provided by the present example, where the phase difference between the measuring clock and the synchronizing clock is calculated in each clock cycle of the measuring clock to achieve more accurate compensation on the photon time in the clock cycle, and the photon time in a certain clock cycle is compensated with a compensation value corresponding to the clock cycle. The different time calibration boards all use the dynamic compensation method, such that more accurate measurements of photon times by the different time calibration boards are achieved simultaneously, thus improving the accuracy of subsequent time compliance determination. In addition, the method provided by the present example adopts the statistical averaging method, which further eliminates clock jitter in the statistical averaging mode and achieves more accurate time calibration.

Figure 6:
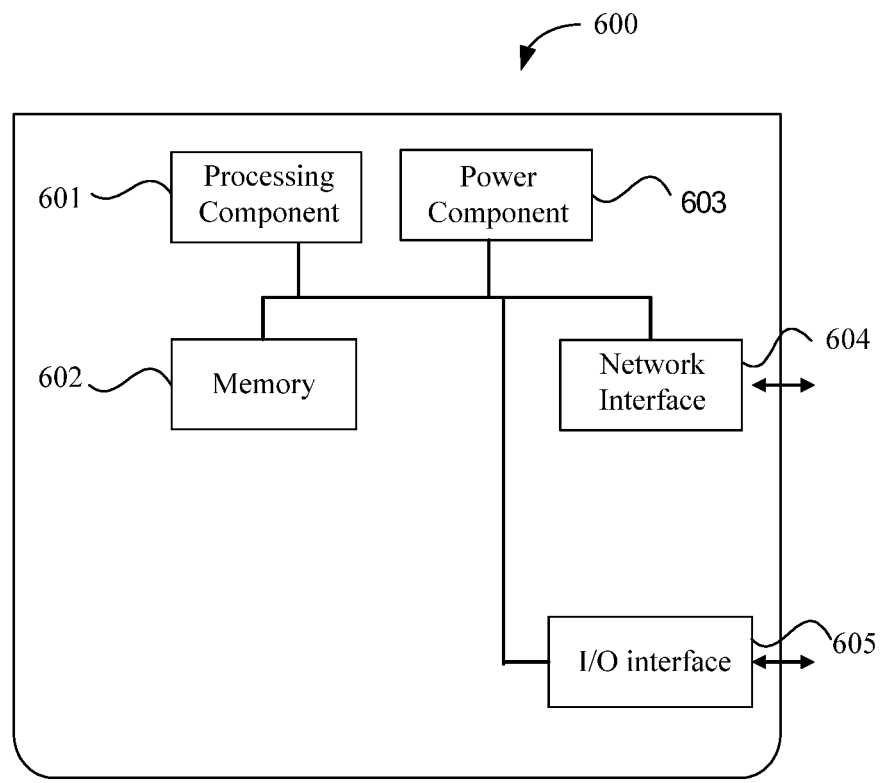
FIG. 6 is a structural diagram of an information processing apparatus in accordance with one or more examples of the present disclosure.

The present application also provides an information processing apparatus. FIG. 6 is a block diagram of an information processing apparatus 600 according to an example. Referring to FIG. 6, the information processing apparatus 600 may include a processing component 601 including one or more processors, and a memory system represented by a memory 602, configured to store instructions which can be executed by the processing component 601. The instructions stored in the memory 602 may include one or more modules, each of which corresponds to a set of instructions.

In an example of the present application, a device for clock synchronization between time calibration boards may be located in the memory 602, and the processing component 601 may execute, through this device, the method of clock synchronization as described herein. For example, the device can include a non-transitory computer-readable storage medium having instructions stored thereon which, when executed by the processing component 601, cause the processing component 601 to perform the method of clock synchronization.

The information processing apparatus 600 may also include a power component 603 for performing power management on the information processing apparatus 600, a wired or wireless network interface 604 connecting the information processing apparatus 600 to a network, and an input/output (I/O) interface 605.

Figure 7:
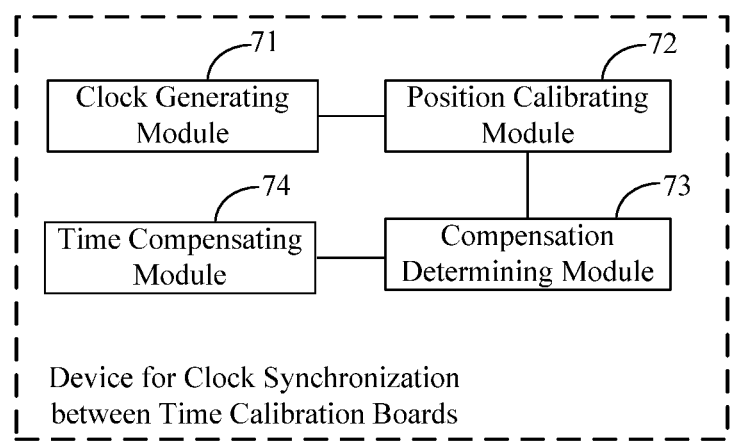
FIG. 7 is a structural schematic diagram of a device for clock synchronization in accordance with one or more examples of the present disclosure.

The device of clock synchronization between the time calibration boards in an example of the present application may be logically divided into a plurality of modules which, for example, may be applied to the information processing apparatus 600 including time calibration board. The time calibration board can include a Field-Programmable Gate Array (FPGA), so that the following module functions may be realized by the circuit structure on FPGA. As shown in FIG. 7, the device may include a clock generating module 71, a position calibrating module 72, a compensation determining module 73, and a time compensating module 74.

The clock generating module 71 is configured to locally generate a measuring clock for calibrating a photon time.

The position calibrating module 72 is configured to receive a synchronizing clock for clock synchronization between the different time calibration boards in a unit clock cycle of the measuring clock and calibrate the position information of a rising edge of the synchronizing clock in the unit clock cycle.

The compensating determination module 73 is configured to determine a phase difference between the measuring clock and the synchronizing clock in the unit clock cycle according to the position information to be a time compensation value.

The time compensating module 74 is configured to compensate the photon time with the time compensation value after the photon time is calibrated in the unit clock cycle of the measuring clock.

In an example, the position calibrating module 72 is further configured to, when calibrating the position information of the rising edge of the synchronizing clock in the unit clock cycle, perform statistical averaging on the position information of the rising edge calibrated in the current unit clock cycle and the position information of the rising edges calibrated in preset times of unit clock cycles prior to the unit clock cycle and consider the position information obtained through statistical averaging to be the position information in the current unit clock cycle.

In an example, the position calibrating module 72 is further configured to, when calibrating the position information of the rising edge of the synchronizing clock in the unit clock cycle, calibrate the position information of the rising edge by a locally generated calibrating clock and carry chains. The clock cycle of the calibrating clock is less than the clock cycle of the synchronizing clock, and the calibrating clock is timed by a plurality of carry chains.

In an example, the synchronizing clock and the measuring clock have the same in clock cycle, and the unit clock cycle is one clock cycle.

Figure 8:
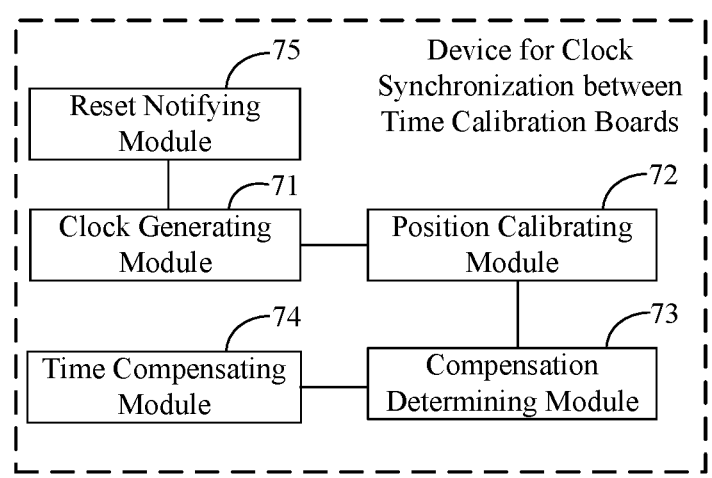
FIG. 8 is a structural schematic diagram of the device for clock synchronization in accordance with one or more examples of the present disclosure.

In an example, referring to FIG. 8, the device may also include a reset notifying module 75 configured to receive a reset signal for resetting the time calibration board after a predetermined time. The setting of the predetermined time ensures that all the time calibration boards to be synchronized start operating already after the predetermined time.

When the function of clock synchronization between the time calibration boards in an example of the present application is implemented in the form of software function units and sold or used as an independent product, it can be stored in a computer readable storage medium. Based on such an understanding, the technical solutions of the present application substantially or the parts making contributions to the prior art or part of the technical solutions may be embodied in the form of a software product. The computer software product is stored in a storage medium, and includes a plurality of instructions used for causing an information processing apparatus to execute all or part of the steps of the method described in various examples of the present application. The foregoing storage medium includes various mediums capable of storing program codes, such as a USB flash drive, a mobile hard disk, a Read-Only Memory (ROM), a Random Access Memory (RAM), a magnetic disk, an optical disk, and the like.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

The foregoing descriptions are merely preferred examples of the present application and not intended to limit the present application. Any modification, equivalent replacement, improvement and the like made within the spirit and principles of the present application should fall into the scope of protection of the present application.

The invention claimed is:

1. A method of clock synchronization, comprising:
receiving a synchronizing clock from a compliance processing board in a unit clock cycle of a measuring clock, wherein the compliance processing board is configured to transmit the synchronizing clock to a plurality of time calibration boards for clock synchronization between the plurality of time calibration boards;
calibrating position information of a rising edge of the synchronizing clock in the unit clock cycle;
determining a phase difference between the measuring clock and the synchronizing clock in the unit clock cycle based on the calibrated position information;
determining compensated photon time in the unit clock cycle with the determined phase difference; and
transmitting the compensated photon time to the compliance processing board, wherein the compliance processing board is configured to receive photon times from the plurality of time calibration boards and carry out compliance determination among the received photon times.

2. The method of claim 1, wherein calibrating the position information of the rising edge of the synchronizing clock in the unit clock cycle comprises:
statistically averaging position information of the rising edge of the synchronizing clock obtained before the calibrating in a current unit clock cycle and position information of rising edges calibrated in predetermined times of unit clock cycles prior to the current unit clock cycle; and
determining a result of the statistically averaging to be the position information of the rising edge in the current unit clock cycle.

3. The method of claim 1, wherein calibrating the position information of the rising edge of the synchronizing clock in the unit clock cycle comprises:
generating a calibration clock having a clock cycle shorter than a clock cycle of the synchronizing clock, the clock cycle of the calibrating clock including a plurality of carry chains; and
determining, by the calibration clock, the position information of the rising edge of the synchronizing clock using the carry chains and the clock cycle of the calibration clock.

4. The method of claim 1, wherein a clock cycle of the measuring clock is shorter than a clock cycle of the synchronizing clock, and the clock cycle of the measuring clock is timed by a plurality of carry chains, and
wherein calibrating the position information of the rising edge of the synchronizing clock in the unit clock cycle comprises determining the position information of the rising edge of the synchronizing clock in the unit clock cycle by using the carry chains and the clock cycle of the measuring clock.

5. The method of claim 1, further comprising:
generating the measuring clock configured to calibrate the photon time, a length of a clock cycle of the measuring clock being determined based on a length of a time slice during which at most one photon time is detected.

6. The method of claim 1, wherein the unit clock cycle is based on a clock cycle of the synchronizing clock and a clock cycle of the measuring clock, wherein the unit clock cycle comprises one clock cycle of the measuring clock when the clock cycle of the synchronizing clock is same as the clock cycle of the measuring clock, and wherein the unit clock cycle comprises two or more clock cycles of the measuring clock when the clock cycle of the synchronizing clock is longer than the clock cycle of the measuring clock.

7. The method of claim 1, further comprising:

after receiving the synchronizing clock from the compliance processing board for a predetermined period of time and before calibrating the position information of the rising edge of the synchronizing clock in the unit clock cycle, receiving a reset signal from the compliance processing board for transmitting the reset signal to the plurality of time calibration boards for simultaneously resetting the plurality of time calibration boards, wherein the predetermined period of time is configured to ensure that the plurality of time calibration boards to be synchronized have started to operate in the predetermined period of time.

8. The method of claim 1, wherein receiving the synchronizing clock comprises receiving the synchronizing clock via a shielded wire.

9. An information processing apparatus comprising:

at least one processor; and at least one non-transitory machine-readable storage medium coupled to the at least one processor having machine-executable instructions stored thereon that, when executed by the at least one processor, cause the at least one processor to perform operations comprising:

locally generating a measuring clock for calibrating a photon time;

receiving a synchronizing clock from a compliance processing board in a unit clock cycle of the measuring clock, wherein the compliance processing board is configured to transmit the synchronizing clock to a plurality of time calibration boards for clock synchronization between the plurality of time calibration boards;

calibrating position information of a rising edge of the synchronizing clock in the unit clock cycle;

determining a phase difference between the measuring clock and the synchronizing clock in the unit clock cycle based on the calibrated position information;

determining compensated photon time with the determined phase difference; and transmitting the compensated photon time to the compliance processing board, wherein the compliance processing board is configured to receive photon times from the plurality of time calibration boards and carry out compliance determination among the received photon times.

10. The information processing apparatus of claim 9, wherein calibrating the position information of the rising edge of the synchronizing clock in the unit clock cycle comprises:

statistically averaging position information of the rising edge of the synchronizing clock obtained before the calibrating in a current unit clock cycle and position information of rising edges calibrated in predetermined times of unit clock cycles prior to the current unit clock cycle, and determining a result of the statistically averaging to be the position information of the rising edge in the current unit clock cycle.

11. The information processing apparatus of claim 9, wherein calibrating the position information of the rising edge of the synchronizing clock in the unit clock cycle comprises:

generating a calibration clock having a clock cycle shorter than a clock cycle of the synchronizing clock, the clock cycle of the calibrating clock including a plurality of carry chains, and determining, by the calibration clock, the position information of the rising edge of the synchronizing clock using the carry chains and the clock cycle of the calibration clock.

12. The information processing apparatus of claim 9, wherein a clock cycle of the measuring clock is shorter than a clock cycle of the synchronizing clock, and the clock cycle of the measuring clock is timed by a plurality of carry chains, and wherein the operations comprise calibrating the position information of the rising edge of the synchronizing clock in the unit clock cycle by determining the position information of the rising edge of the synchronizing clock in the unit clock cycle by using the carry chains and the clock cycle of the measuring clock.

13. The information processing apparatus of claim 9, wherein a length of a clock cycle of the measuring clock is determined based on a length of a time slice during which at most one photon time is detected, wherein the unit clock cycle is based on the clock cycle of the measuring clock and a clock cycle of the synchronizing clock, wherein the unit clock cycle comprises one clock cycle of the measuring clock when the clock cycle of the synchronizing clock has the same length the clock cycle of the measuring clock, and wherein the unit clock cycle comprises two or more clock cycles of the measuring clock when the clock cycle of the synchronizing clock is longer than the clock cycle of the measuring clock.

14. The information processing apparatus of claim 9, wherein the operations further comprise:

after receiving the synchronizing clock from the compliance processing board for a predetermined period of time and before calibrating the position information of the rising edge of the synchronizing clock in the unit clock cycle, receive a reset signal from the compliance processing board configured to transmit the reset signal to the plurality of time calibration boards for simultaneously resetting the plurality of time calibration boards, wherein the predetermined period of time is to ensure that the plurality of time calibration boards to be synchronized have started to operate in the predetermined period of time.

15. The information processing apparatus of claim 9, wherein the synchronizing clock is transmitted from the compliance processing board to the plurality of time calibration boards via shielded wires.

16. A non-transitory computer-readable storage medium having instructions stored thereon which, when executed by one or more processors, cause the one or more processors to perform the method of clock synchronization in claim 1.

17. A method of clock synchronization, comprising:

receiving a synchronizing clock from a compliance processing board in a unit clock cycle of a measuring clock, wherein the compliance processing board is configured to transmit the synchronizing clock to a plurality of time calibration boards for clock synchronization between the plurality of time calibration boards;

after receiving the synchronizing clock from the compliance processing board for a predetermined period of time, receiving a reset signal from the compliance processing board for transmitting the reset signal to the plurality of time calibration boards for simultaneously resetting the plurality of time calibration boards, wherein the predetermined period of time is configured to ensure that the plurality of time calibration boards to be synchronized have started to operate in the predetermined period of time;

calibrating position information of a rising edge of the synchronizing clock in the unit clock cycle;

determining a phase difference between the measuring clock and the synchronizing clock in the unit clock cycle based on the calibrated position information; and determining compensated photon time in the unit clock cycle with the determined phase difference.

\* \* \* \* \*